(12) United States Patent
Chui et al.

(10) Patent No.: US 7,492,502 B2
(45) Date of Patent: Feb. 17, 2009

(54) METHOD OF FABRICATING A FREE-STANDING MICROSTRUCTURE

(75) Inventors: Clarence Chui, San Mateo, CA (US); Jeffrey B. Sampsell, San Jose, CA (US)

(73) Assignee: IDC, LLC, San Francisco, CA (US)

( * ) Notice: Subject to any disclaimer, the term of this patent is extended or adjusted under 35 U.S.C. 154(b) by 334 days.

(21) Appl. No.: 11/198,127

(22) Filed: Aug. 5, 2005

(65) Prior Publication Data

US 2006/0077529 A1 Apr. 13, 2006

Related U.S. Application Data

(60) Provisional application No. 60/613,299, filed on Sep. 27, 2004.

(51) Int. Cl.
*G02B 26/00* (2006.01)
*G02B 26/08* (2006.01)
*G02F 1/29* (2006.01)

(52) U.S. Cl. .................. 359/291; 359/290; 359/292; 359/298

(58) Field of Classification Search ........... 359/290, 359/291, 292, 295, 298
See application file for complete search history.

(56) References Cited

U.S. PATENT DOCUMENTS

| | | |
|---|---|---|
| 2,534,846 A | 12/1950 | Ambrose et al. |
| 3,439,973 A | 4/1969 | Paul et al. |
| 3,443,854 A | 5/1969 | Weiss |
| 3,616,312 A | 10/1971 | McGriff et al. |
| 3,653,741 A | 4/1972 | Marks |
| 3,656,836 A | 4/1972 | de Cremoux et al. |
| 3,725,868 A | 4/1973 | Malmer, Jr. et al. |
| 3,813,265 A | 5/1974 | Marks |
| 3,955,880 A | 5/1976 | Lierke |
| 4,099,854 A | 7/1978 | Decker et al. |
| 4,196,396 A | 4/1980 | Smith |
| 4,228,437 A | 10/1980 | Shelton |

(Continued)

FOREIGN PATENT DOCUMENTS

CH 681 047 12/1992

(Continued)

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

(Continued)

*Primary Examiner*—Ricky L Mack
*Assistant Examiner*—Brandi N Thomas
(74) *Attorney, Agent, or Firm*—Knobbe, Martens, Olson & Bear, LLP

(57) ABSTRACT

Provided is a MEMS device comprising an integrated post and deformable layer. In some embodiments, the transition between the post and deformable layer comprises substantially a single arcuate or convex surface, thereby providing a mechanically robust structure. Some embodiments provide a method for fabricating a MEMS device comprising the use of a self-planarizing sacrificial material, which provides a surface conducive to the formation of a relatively uniform deformable layer thereon.

17 Claims, 12 Drawing Sheets

U.S. PATENT DOCUMENTS

| | | |
|---|---|---|
| 4,377,324 A | 3/1983 | Durand et al. |
| 4,389,096 A | 6/1983 | Hori et al. |
| 4,392,711 A | 7/1983 | Moraw et al. |
| 4,403,248 A | 9/1983 | te Velde |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Kitagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,513 A | 5/1994 | Florence et al. |
| 5,315,370 A | 5/1994 | Bulow |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |

| | | | |
|---|---|---|---|
| 5,619,365 A | 4/1997 | Rhoades et al. |
| 5,619,366 A | 4/1997 | Rhoads et al. |
| 5,622,814 A | 4/1997 | Miyata et al. |
| 5,629,790 A | 5/1997 | Neukermans et al. |
| 5,633,652 A | 5/1997 | Kanbe et al. |
| 5,636,052 A | 6/1997 | Arney et al. |
| 5,636,185 A | 6/1997 | Brewer et al. |
| 5,638,084 A | 6/1997 | Kalt |
| 5,638,946 A | 6/1997 | Zavracky |
| 5,641,391 A | 6/1997 | Hunter et al. |
| 5,646,768 A | 7/1997 | Kaeiyama |
| 5,647,819 A | 7/1997 | Fujita et al. |
| 5,650,834 A | 7/1997 | Nakagawa et al. |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,665,997 A | 9/1997 | Weaver et al. |
| 5,673,139 A | 9/1997 | Johnson |
| 5,674,757 A | 10/1997 | Kim |
| 5,683,591 A | 11/1997 | Offenberg |
| 5,703,710 A | 12/1997 | Brinkman et al. |
| 5,706,022 A | 1/1998 | Hato |
| 5,710,656 A | 1/1998 | Goosen |
| 5,726,480 A | 3/1998 | Pister |
| 5,739,945 A | 4/1998 | Tayebati |
| 5,745,193 A | 4/1998 | Urbanus et al. |
| 5,745,281 A | 4/1998 | Yi et al. |
| 5,771,116 A | 6/1998 | Miller et al. |
| 5,784,190 A | 7/1998 | Worley |
| 5,784,212 A | 7/1998 | Hornbeck |
| 5,793,504 A | 8/1998 | Stoll |
| 5,808,780 A | 9/1998 | McDonald |
| 5,818,095 A | 10/1998 | Sampsell |
| 5,822,110 A | 10/1998 | Dabbaj |
| 5,822,170 A | 10/1998 | Cabuz et al. |
| 5,824,608 A | 10/1998 | Gotoch et al. |
| 5,825,528 A | 10/1998 | Goosen |
| 5,835,255 A | 11/1998 | Miles |
| 5,838,484 A | 11/1998 | Goosen et al. |
| 5,842,088 A | 11/1998 | Thompson |
| 5,867,302 A | 2/1999 | Fleming et al. |
| 5,896,796 A | 4/1999 | Chih |
| 5,912,758 A | 6/1999 | Knipe et al. |
| 5,943,158 A | 8/1999 | Ford et al. |
| 5,959,763 A | 9/1999 | Bozler et al. |
| 5,967,163 A | 10/1999 | Pan et al. |
| 5,972,193 A | 10/1999 | Chou et al. |
| 5,976,902 A | 11/1999 | Shih |
| 5,986,796 A | 11/1999 | Miles |
| 6,016,693 A | 1/2000 | Viani et al. |
| 6,028,690 A | 2/2000 | Carter et al. |
| 6,031,653 A | 2/2000 | Wang |
| 6,038,056 A | 3/2000 | Florence et al. |
| 6,040,937 A | 3/2000 | Miles |
| 6,049,317 A | 4/2000 | Thompson et al. |
| 6,055,090 A | 4/2000 | Miles |
| 6,057,903 A | 5/2000 | Colgan et al. |
| 6,061,075 A | 5/2000 | Nelson et al. |
| 6,099,132 A | 8/2000 | Kaeriyama |
| 6,100,872 A | 8/2000 | Aratani et al. |
| 6,113,239 A | 9/2000 | Sampsell et al. |
| 6,115,326 A | 9/2000 | Puma et al. |
| 6,147,790 A | 11/2000 | Meier et al. |
| 6,158,156 A | 12/2000 | Patrick |
| 6,160,833 A | 12/2000 | Floyd et al. |
| 6,165,890 A | 12/2000 | Kohl et al. |
| 6,166,422 A | 12/2000 | Qian et al. |
| 6,180,428 B1 | 1/2001 | Peeters et al. |
| 6,194,323 B1 | 2/2001 | Downey et al. |
| 6,195,196 B1 | 2/2001 | Kimura et al. |
| 6,201,633 B1 | 3/2001 | Peeters et al. |
| 6,204,080 B1 | 3/2001 | Hwang |
| 6,215,221 B1 | 4/2001 | Cabuz et al. |
| 6,219,015 B1 | 4/2001 | Bloom et al. |
| 6,232,936 B1 | 5/2001 | Gove et al. |
| 6,243,149 B1 | 6/2001 | Swanson et al. |
| 6,246,398 B1 | 6/2001 | Koo |
| 6,249,039 B1 | 6/2001 | Harvey et al. |
| 6,275,220 B1 | 8/2001 | Nitta |
| 6,282,010 B1 | 8/2001 | Sulzbach et al. |
| 6,284,560 B1 | 9/2001 | Jech et al. |
| 6,288,472 B1 | 9/2001 | Cabuz et al. |
| 6,288,824 B1 | 9/2001 | Kastalsky et al. |
| 6,295,154 B1 | 9/2001 | Laor et al. |
| 6,297,072 B1 | 10/2001 | Tilmans et al. |
| 6,323,982 B1 | 11/2001 | Hornbeck |
| 6,327,071 B1 | 12/2001 | Kimura et al. |
| 6,329,297 B1 | 12/2001 | Balish et al. |
| 6,335,224 B1 | 1/2002 | Peterson |
| 6,335,831 B2 | 1/2002 | Kowarz et al. |
| 6,351,329 B1 | 2/2002 | Greywal |
| 6,351,577 B1 * | 2/2002 | Aksyuk et al. ............... 385/15 |
| 6,356,254 B1 | 3/2002 | Kimura |
| 6,359,673 B1 | 3/2002 | Stephenson |
| 6,376,787 B1 | 4/2002 | Martin et al. |
| 6,377,233 B2 | 4/2002 | Colgan et al. |
| 6,391,675 B1 | 5/2002 | Ehmke et al. |
| 6,392,233 B1 | 5/2002 | Channin et al. |
| 6,392,781 B1 | 5/2002 | Kim et al. |
| 6,407,851 B1 | 6/2002 | Islam et al. |
| 6,438,282 B1 | 8/2002 | Takeda et al. |
| 6,447,126 B1 | 9/2002 | Hornbeck |
| 6,452,465 B1 | 9/2002 | Brown et al. |
| 6,456,420 B1 | 9/2002 | Goodwin-Johansson |
| 6,465,355 B1 | 10/2002 | Horsley |
| 6,466,354 B1 | 10/2002 | Gudeman |
| 6,466,358 B2 | 10/2002 | Tew |
| 6,473,274 B1 | 10/2002 | Maimone et al. |
| 6,480,177 B2 | 11/2002 | Doherty et al. |
| 6,496,122 B2 | 12/2002 | Sampsell |
| 6,513,911 B1 | 2/2003 | Ozaki et al. |
| 6,522,801 B1 | 2/2003 | Aksyuk et al. |
| 6,531,945 B1 | 3/2003 | Ahn et al. |
| 6,537,427 B1 | 3/2003 | Raina et al. |
| 6,545,335 B1 | 4/2003 | Chua et al. |
| 6,548,908 B2 | 4/2003 | Chua et al. |
| 6,549,338 B1 | 4/2003 | Wolverton et al. |
| 6,552,840 B2 | 4/2003 | Knipe |
| 6,574,033 B1 | 6/2003 | Chui et al. |
| 6,577,785 B1 | 6/2003 | Spahn et al. |
| 6,589,625 B1 | 7/2003 | Kothari et al. |
| 6,600,201 B2 | 7/2003 | Hartwell et al. |
| 6,602,791 B2 | 8/2003 | Ouellet et al. |
| 6,606,175 B1 | 8/2003 | Sampsell et al. |
| 6,608,268 B1 | 8/2003 | Goldsmith |
| 6,610,440 B1 | 8/2003 | LaFollette et al. |
| 6,618,187 B2 | 9/2003 | Pilossof |
| 6,624,944 B1 | 9/2003 | Wallace et al. |
| 6,625,047 B2 | 9/2003 | Coleman, Jr., deceased |
| 6,630,786 B2 | 10/2003 | Cummings et al. |
| 6,632,698 B2 | 10/2003 | Ives |
| 6,635,919 B1 | 10/2003 | Melendez et al. |
| 6,642,913 B1 | 11/2003 | Kimura et al. |
| 6,643,069 B2 | 11/2003 | Dewald |
| 6,650,455 B2 | 11/2003 | Miles et al. |
| 6,657,832 B2 | 12/2003 | Williams et al. |
| 6,666,561 B1 | 12/2003 | Blakley |
| 6,671,149 B1 | 12/2003 | Chea et al. |
| 6,674,090 B1 | 1/2004 | Chua et al. |
| 6,674,562 B1 | 1/2004 | Miles et al. |
| 6,674,563 B2 | 1/2004 | Chui et al. |
| 6,680,792 B2 | 1/2004 | Miles |
| 6,706,548 B2 * | 3/2004 | Liu ............................ 438/52 |
| 6,710,908 B2 | 3/2004 | Miles et al. |
| 6,713,235 B1 | 3/2004 | Ide et al. |

| Patent No. | Date | Inventor(s) |
|---|---|---|
| 6,720,267 B1 | 4/2004 | Chen et al. |
| 6,736,987 B1 | 5/2004 | Cho |
| 6,741,377 B2 | 5/2004 | Miles |
| 6,741,384 B1 | 5/2004 | Martin et al. |
| 6,741,503 B1 | 5/2004 | Farris et al. |
| 6,743,570 B2 | 6/2004 | Harnett et al. |
| 6,747,785 B2 | 6/2004 | Chen et al. |
| 6,747,800 B1 | 6/2004 | Lin |
| 6,756,317 B2 | 6/2004 | Sniegowski et al. |
| 6,768,097 B1 | 7/2004 | Viktorovitch et al. |
| 6,775,174 B2 | 8/2004 | Huffman et al. |
| 6,778,155 B2 | 8/2004 | Doherty et al. |
| 6,778,306 B2 | 8/2004 | Sniegowski et al. |
| 6,782,166 B1 | 8/2004 | Grote et al. |
| 6,794,119 B2 | 9/2004 | Miles |
| 6,806,110 B2 | 10/2004 | Lester et al. |
| 6,809,788 B2 | 10/2004 | Yamada et al. |
| 6,811,267 B1 | 11/2004 | Allen et al. |
| 6,812,482 B2 | 11/2004 | Fleming et al. |
| 6,819,469 B1 | 11/2004 | Koba |
| 6,822,628 B2 | 11/2004 | Dunphy et al. |
| 6,829,132 B2 | 12/2004 | Martin et al. |
| 6,853,129 B1 | 2/2005 | Cummings et al. |
| 6,855,610 B2 | 2/2005 | Tung et al. |
| 6,859,218 B1 | 2/2005 | Luman et al. |
| 6,859,301 B1 | 2/2005 | Islam et al. |
| 6,861,277 B1 | 3/2005 | Monroe et al. |
| 6,862,022 B2 | 3/2005 | Slupe |
| 6,862,029 B1 | 3/2005 | D'Souza et al. |
| 6,867,896 B2 | 3/2005 | Miles |
| 6,870,581 B2 | 3/2005 | Li et al. |
| 6,870,654 B2 | 3/2005 | Lin et al. |
| 6,882,458 B2 | 4/2005 | Lin et al. |
| 6,882,461 B1 | 4/2005 | Tsai et al. |
| 6,905,621 B2 | 6/2005 | Ho et al. |
| 6,912,022 B2 | 6/2005 | Lin et al. |
| 6,947,200 B2 | 9/2005 | Huibers |
| 6,952,303 B2 | 10/2005 | Lin et al. |
| 6,952,304 B2 | 10/2005 | Mushika et al. |
| 6,953,702 B2 | 10/2005 | Miller et al. |
| 6,958,847 B2 | 10/2005 | Lin |
| 6,959,990 B2 | 11/2005 | Penn |
| 6,980,350 B2 | 12/2005 | Hung et al. |
| 6,982,820 B2 | 1/2006 | Tsai |
| 6,995,890 B2 | 2/2006 | Lin |
| 6,999,225 B2 | 2/2006 | Lin |
| 6,999,236 B2 | 2/2006 | Lin |
| 7,008,812 B1 | 3/2006 | Carley |
| 7,012,726 B1 | 3/2006 | Miles |
| 7,027,202 B1 | 4/2006 | Hunter et al. |
| 7,041,224 B2 | 5/2006 | Patel et al. |
| 7,041,571 B2 | 5/2006 | Strane |
| 7,049,164 B2 | 5/2006 | Bruner |
| 7,064,880 B2 | 6/2006 | Mushika |
| 7,078,293 B2 | 7/2006 | Lin et al. |
| 7,110,158 B2 | 9/2006 | Miles |
| 7,119,945 B2 | 10/2006 | Cummings et al. |
| 7,123,216 B1 | 10/2006 | Miles |
| 7,142,346 B2 | 11/2006 | Chui et al. |
| 7,145,213 B1 | 12/2006 | Ebel |
| 7,172,915 B2 | 2/2007 | Lin et al. |
| 7,198,973 B2 | 4/2007 | Lin et al. |
| 7,221,495 B2 | 5/2007 | Miles et al. |
| 2001/0003487 A1 | 6/2001 | Miles |
| 2001/0026951 A1 | 10/2001 | Vergani et al. |
| 2001/0040649 A1 | 11/2001 | Ozaki |
| 2001/0040675 A1 | 11/2001 | True et al. |
| 2002/0014579 A1 | 2/2002 | Dunfield |
| 2002/0015215 A1 | 2/2002 | Miles |
| 2002/0021485 A1 | 2/2002 | Pilossof |
| 2002/0024711 A1 | 2/2002 | Miles |
| 2002/0027636 A1 | 3/2002 | Yamada |
| 2002/0036304 A1 | 3/2002 | Ehmke et al. |
| 2002/0054424 A1 | 5/2002 | Miles |
| 2002/0055253 A1 | 5/2002 | Rudhard |
| 2002/0071169 A1 | 6/2002 | Bowers et al. |
| 2002/0075555 A1 | 6/2002 | Miles |
| 2002/0086455 A1 | 7/2002 | Franosch et al. |
| 2002/0110948 A1 | 8/2002 | Huang et al. |
| 2002/0114558 A1 | 8/2002 | Nemirovsky |
| 2002/0117728 A1 | 8/2002 | Brosnihan et al. |
| 2002/0126364 A1 | 9/2002 | Miles |
| 2002/0131682 A1 | 9/2002 | Nasiri et al. |
| 2002/0135857 A1 | 9/2002 | Fitzpatrick et al. |
| 2002/0137072 A1 | 9/2002 | Mirkin et al. |
| 2002/0145185 A1 | 10/2002 | Shrauger |
| 2002/0149828 A1 | 10/2002 | Miles et al. |
| 2002/0167730 A1 | 11/2002 | Needham et al. |
| 2002/0168136 A1 | 11/2002 | Atia et al. |
| 2002/0171610 A1 | 11/2002 | Siwinski et al. |
| 2002/0186209 A1 | 12/2002 | Cok |
| 2003/0006468 A1 | 1/2003 | Ma et al. |
| 2003/0015936 A1 | 1/2003 | Yoon et al. |
| 2003/0043157 A1 | 3/2003 | Miles |
| 2003/0053078 A1 | 3/2003 | Missey et al. |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0090350 A1 | 5/2003 | Feng et al. |
| 2003/0112096 A1 | 6/2003 | Potter |
| 2003/0123123 A1 | 7/2003 | Huffman |
| 2003/0132822 A1 | 7/2003 | Ko et al. |
| 2003/0138213 A1 | 7/2003 | Jiin et al. |
| 2003/0152872 A1 | 8/2003 | Miles |
| 2003/0156315 A1 | 8/2003 | Li et al. |
| 2003/0179527 A1 | 9/2003 | Chea |
| 2003/0201784 A1 | 10/2003 | Potter |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2003/0210851 A1 | 11/2003 | Fu et al. |
| 2003/0231373 A1 | 12/2003 | Kowarz et al. |
| 2004/0010115 A1 | 1/2004 | Sotzing |
| 2004/0027636 A1 | 2/2004 | Miles |
| 2004/0027701 A1 | 2/2004 | Ishikawa |
| 2004/0028849 A1 | 2/2004 | Stark et al. |
| 2004/0035821 A1 | 2/2004 | Doan et al. |
| 2004/0038513 A1 | 2/2004 | Kohl et al. |
| 2004/0051929 A1 | 3/2004 | Sampsell et al. |
| 2004/0053434 A1 | 3/2004 | Bruner |
| 2004/0058531 A1 | 3/2004 | Miles et al. |
| 2004/0058532 A1 | 3/2004 | Miles et al. |
| 2004/0061543 A1 | 4/2004 | Nam et al. |
| 2004/0063322 A1 | 4/2004 | Yang |
| 2004/0080807 A1 | 4/2004 | Chen et al. |
| 2004/0080832 A1 | 4/2004 | Singh |
| 2004/0087086 A1 | 5/2004 | Lee |
| 2004/0100677 A1 | 5/2004 | Huibers et al. |
| 2004/0124073 A1 | 7/2004 | Pilans et al. |
| 2004/0124483 A1 | 7/2004 | Partridge et al. |
| 2004/0124495 A1 | 7/2004 | Chen et al. |
| 2004/0125281 A1 | 7/2004 | Lin et al. |
| 2004/0125282 A1 | 7/2004 | Lin et al. |
| 2004/0125347 A1 | 7/2004 | Patel et al. |
| 2004/0125536 A1 | 7/2004 | Arney et al. |
| 2004/0136076 A1 | 7/2004 | Tayebati |
| 2004/0140557 A1 | 7/2004 | Sun et al. |
| 2004/0145049 A1 | 7/2004 | McKinnell et al. |
| 2004/0145811 A1 | 7/2004 | Lin et al. |
| 2004/0147056 A1 | 7/2004 | McKinnell et al. |
| 2004/0147198 A1 | 7/2004 | Lin et al. |
| 2004/0148009 A1 | 7/2004 | Buzzard |
| 2004/0150869 A1 | 8/2004 | Kasai |
| 2004/0150936 A1 | 8/2004 | Chea |
| 2004/0160143 A1 | 8/2004 | Shreeve et al. |
| 2004/0174583 A1 | 9/2004 | Chen et al. |

| | | | | | |
|---|---|---|---|---|---|
| 2004/0175577 A1 | 9/2004 | Lin et al. | JP | 49-004993 | 1/1974 |
| 2004/0179281 A1 | 9/2004 | Reboa | JP | 02-068513 | 3/1990 |
| 2004/0179445 A1 | 9/2004 | Park | JP | 405275401 A | 10/1993 |
| 2004/0191937 A1 | 9/2004 | Patel et al. | JP | 10500224 | 1/1998 |
| 2004/0191946 A1 | 9/2004 | Patel et al. | JP | 10-148644 | 6/1998 |
| 2004/0197526 A1 | 10/2004 | Mehta | JP | 10-267658 | 10/1998 |
| 2004/0207897 A1 | 10/2004 | Lin | JP | 11211999 A | 8/1999 |
| 2004/0207898 A1 | 10/2004 | Lin et al. | JP | 11243214 | 9/1999 |
| 2004/0209192 A1 | 10/2004 | Lin et al. | JP | 2000-40831 A | 2/2000 |
| 2004/0209195 A1 | 10/2004 | Lin | JP | 2001-085519 | 3/2001 |
| 2004/0212026 A1 | 10/2004 | Van Brocklin et al. | JP | 2002-0287047 | 3/2001 |
| 2004/0217264 A1 | 11/2004 | Wood et al. | JP | 2002 062493 | 2/2002 |
| 2004/0217378 A1 | 11/2004 | Martin et al. | JP | 2002-062505 | 2/2002 |
| 2004/0217919 A1 | 11/2004 | Pichl et al. | JP | 2002-207182 | 7/2002 |
| 2004/0218251 A1 | 11/2004 | Piehl et al. | JP | 2002-243937 | 8/2002 |
| 2004/0218334 A1 | 11/2004 | Martin et al. | JP | 2002-270575 | 9/2002 |
| 2004/0218341 A1 | 11/2004 | Martin et al. | JP | 2002-328313 | 11/2002 |
| 2004/0227493 A1 | 11/2004 | Van Brocklin et al. | JP | 2002-355800 | 12/2002 |
| 2004/0233503 A1 | 11/2004 | Kimura | JP | 2003001598 A | 1/2003 |
| 2004/0240027 A1 | 12/2004 | Lin et al. | JP | 2004-102022 A | 4/2004 |
| 2004/0240032 A1 | 12/2004 | Miles | JP | 2004-133281 | 4/2004 |
| 2004/0240138 A1 | 12/2004 | Martin et al. | JP | 2004106074 A | 4/2004 |
| 2004/0245588 A1 | 12/2004 | Nikkel et al. | JP | 2004-212656 | 7/2004 |
| 2004/0263944 A1 | 12/2004 | Miles et al. | JP | 2005051007 A | 2/2005 |
| 2005/0001828 A1 | 1/2005 | Martin et al. | KR | 2002-9270 | 10/1999 |
| 2005/0003667 A1 | 1/2005 | Lin et al. | KR | 2000-0033006 | 6/2000 |
| 2005/0014374 A1 | 1/2005 | Partridge et al. | TW | 157313 | 5/1991 |
| 2005/0020089 A1 | 1/2005 | Shi et al. | WO | WO 91/05284 | 4/1991 |
| 2005/0024557 A1 | 2/2005 | Lin | WO | WO 92/10925 | 6/1992 |
| 2005/0030490 A1* | 2/2005 | Huibers ............... 353/99 | WO | WO9530924 | 11/1995 |
| 2005/0035699 A1 | 2/2005 | Tsai | WO | WO9717628 | 5/1997 |
| 2005/0036095 A1 | 2/2005 | Yeh et al. | WO | WO9952006 A2 | 10/1999 |
| 2005/0036192 A1 | 2/2005 | Lin et al. | WO | WO9952006 A3 | 10/1999 |
| 2005/0038950 A1 | 2/2005 | Adelmann | WO | WO0114248 | 3/2001 |
| 2005/0042117 A1 | 2/2005 | Lin | WO | WO 01/063657 | 8/2001 |
| 2005/0046922 A1 | 3/2005 | Lin et al. | WO | WO 02/24570 | 3/2002 |
| 2005/0046948 A1 | 3/2005 | Lin | WO | WO2006/036542 | 4/2002 |
| 2005/0057442 A1 | 3/2005 | Way | WO | WO03007049 A1 | 1/2003 |
| 2005/0068583 A1 | 3/2005 | Gutkowski et al. | WO | WO 03/052506 | 6/2003 |
| 2005/0068605 A1 | 3/2005 | Tsai | WO | WO 03/069404 | 8/2003 |
| 2005/0068606 A1 | 3/2005 | Tsai | WO | WO 03/069413 A | 8/2003 |
| 2005/0069209 A1 | 3/2005 | Damera-Venkata et al. | WO | WO03069413 A1 | 8/2003 |
| 2005/0078348 A1 | 4/2005 | Lin | WO | WO03073151 A1 | 9/2003 |
| 2005/0118832 A1 | 6/2005 | Korzenski et al. | WO | WO2004006003 A1 | 1/2004 |
| 2005/0168849 A1 | 8/2005 | Lin | WO | WO2004026757 A2 | 4/2004 |
| 2005/0195462 A1 | 9/2005 | Lin | WO | WO 2004/055885 | 7/2004 |
| 2005/0195467 A1 | 9/2005 | Kothari et al. | WO | WO 2004/079056 | 9/2004 |
| 2005/0202649 A1 | 9/2005 | Hung et al. | WO | WO 2005/019899 A1 | 3/2005 |
| 2006/0024880 A1 | 2/2006 | Chul et al. | WO | WO 2005/061378 | 7/2005 |
| 2006/0066932 A1 | 3/2006 | Chui et al. | WO | WO 2005/085932 A | 9/2005 |
| 2006/0066935 A1 | 3/2006 | Cummings et al. | WO | WO 2006/036385 | 4/2006 |
| 2006/0256420 A1 | 11/2006 | Miles et al. | WO | WO 2006/036437 | 4/2006 |
| 2006/0257070 A1 | 11/2006 | Lin et al. | | | |
| 2007/0269748 A1 | 11/2007 | Miles | | | |
| 2008/0026328 A1 | 1/2008 | Miles | | | |
| 2008/0068699 A1 | 3/2008 | Miles | | | |

FOREIGN PATENT DOCUMENTS

| | | |
|---|---|---|
| CN | 092109265 | 11/2003 |
| DE | 199 38 072 | 3/2000 |
| DE | 10228946 A1 | 1/2004 |
| EP | 0 035 299 | 9/1983 |
| EP | 0173808 | 3/1986 |
| EP | 0 667 548 A1 | 8/1995 |
| EP | 0694801 A | 1/1996 |
| EP | 0695959 A | 2/1996 |
| EP | 0 788 005 | 8/1997 |
| EP | 0878824 A2 | 11/1998 |
| EP | 1197778 A | 4/2002 |
| EP | 1 209 738 | 5/2002 |
| EP | 1258860 A1 | 11/2002 |
| EP | 1 452 481 A | 9/2004 |

OTHER PUBLICATIONS

Austrian Search Report for EX72/2005 dated May 13, 2005.
Austrian Search Report for EX81/2005 dated May 18, 2005.
Austrian Search Report for EX170/2005 dated Jul. 6, 2005.
Austrian Search Report for EX139/2005 dated Jul. 27, 2005.
Austrian Search Report for EX144/2005 dated Aug. 11, 2005.
Bains, "Digital Paper Display Technology Holds Promise For Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-B327 (2002).
Crouse, "Self-ordered pore structure of anodized aluminum on silicon and pattern transfer" Applied Physics Letters, vol. 76, No. 1, Jan. 3, 2000. pp. 49-51.

Furneaux, et al. "The Formation of Controlled-porosity membranes from Anodically Oxidized Aluminum" Nature vo 337 Jan. 12, 1989, pp. 147-149.

Jerman J. H. et al., "Maniature Fabry-Perot Interferometers Micromachined in Silicon for Use in Optical Fiber WDM Systems," Transducers. San Francisco, Jun. 24-27, 1991, Proceedings of the International Conference on Solid State Sensors Andactuators, New Youk IEEE, US, vol. Conf. 6, Jun. 24, 1991.

Lieberman, "MEMS Display Looks to Give PDAs Sharper Image," EE Times (Feb. 11, 1997).

Lieberman, "Microbridges at Heart of New MEMS Displays," EE Times (Apr. 24, 1997).

Maboudian, et al. Critical Review: Adhesion in Surface Micromechanical Structures: J. Vac. Sci Techno. B 15(1) Jan./Feb. 1997, pp. 1-20.

Microchem, LOR Lift-Off Resists Datasheet, 2002.

Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).

Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).

Penta Vacuum MEMS Etcher Specifications, http://www.pentavacuum.com/memes.htm.

Science and Technology, The Economist, pp. 89-90, (May 1999).

Search Report PCT/US05/031237 (Dec. 29, 2005).

Search Report PCT/US05/030033 and Written Opinion.

Search Report PCT/US05/030902.

Search Report and Written Opinion for PCT/US05/33558 (May 19, 2005).

Search Report PCT/US05/032331 (Apr. 7, 2006).

Search Report PCT/US05/032331 (Jan. 9, 2006).

Search Report and Written Opinion for PCT/US05/032647.

Tayebi et al. "Reducing the Effects of adhesion and friction in microelectomechanical system (MEMS) through surface roughening: Comparison Between theory and experiments" http://jap.ajp.org/jap/copyright.isp Journal of applied Physics 98, 073528 (2005).

Thin Film Transistors—Materials and Processes—vol. 1 Amorphous Silicon Thin Film Transistors ed. Yue Kuo, Kluwer Academic Publishers, Boston (2004).

Xactix Xetch X Specifications, http://xactix.com/Xtech X3specs.htm. Jan. 5, 2005.

Xactix Xetch Product information, 2005.

Akasaka, "Three-Dimensional IC Trends," Proceedings of IEEE, vol. 74, No. 12, pp. 1703-1714, (Dec. 1986).

Austrian Search Report dated May 4, 2005.

Austrian Search Report dated Aug. 12, 2005.

Aratani et al., "Surface micromachined tuneable interferometer array," Sensors and Actuators, pp. 17-23. (1994).

Conner, "Hybrid Color Display Using Optical Interference Filter Array," SID Digest, pp. 577-580 (1993).

EP 05255661.0 European Search Report (Dec. 30, 2005).

Fan et al., "Channel Drop Filters in Photonic Crystals," Optics Express, vol. 3, No. 1 (1998).

Giles et al., "A Silicon MEMS Optical Switch Attenuator and Its Use in Lightwave Subsystems," IEEE Journal of Selected Topics in Quantum Electronics, vol. 5, No. 1, pp. 18-25, (Jan./Feb. 1999).

Goossen et al., "Possible Display Applications of the Silicon Mechanical Anti-Reflection Switch," Society for Information Display (1994).

Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).

Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.

Gosch, "West Germany Grabs the Lead in X-Ray Lithography," Electronics pp. 78-80 (Feb. 5, 1987).

Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.

Howard et al., "Nanometer-Scale Fabrication Techniques," VLSI Electronics: Microstructure Science, vol. 5, pp. 145-153 and pp. 166-173 (1982).

Ibbotson et al., "Comparison of $XeF_2$ and F-atom reactions with Si and $SiO_2$," Applied Physics Letters, vol. 44, No. 12, pp. 1129-1131 (Jun. 1984).

Jackson "Classical Electrodynamics," John Wiley & Sons Inc., pp. 568-573, date unknown.

Jerman et al., "A Miniature Fabry-Perot Interferometer with a Corrugated Silicon Diaphragm Support," (1988).

Joannopoulos et al., "Photonic Crystals: Molding the Flow of Light," Princeton University Press (1995).

Johnson, "Optical Scanners," Microwave Scanning Antennas, vol. 1, p. 251-261, (1964).

Kim et al., "Control of Optical Transmission Through Metals Perforated With Subwavelength Hole Arrays," Optic Letters, vol. 24, No. 4, pp. 256-257, (Feb. 1999).

Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).

Lee et al., "The Surface/Bulk Micromachining (SBM) Process: A New Method for Fabricating Released MEMS in Single Crystal Silicon" Journal of Microelectromechanical Systems, vol. 8, Issue 4, pp. 409-416, (Dec. 1999).

Light over Matter, Circle No. 36 (Jun. 1993).

Lin et al., "Free-Space Micromachined Optical Switches for Optical Networking," IEEE Journal of Selected Topics in Quantum Electronics, vol. 5, No. 1, pp. 4-9. (Jan./Feb. 1999).

Little et al., "Vertically Coupled Microring Resonator Channel Dropping Filter," IEEE Photonics Technology Letters, vol. 11, No. 2, (1999).

Magel, "Integrated Optic Devices Using Micromachined Metal Membranes," SPIE vol. 2686, 0-8194-2060-Mar. (1996).

Miles, Mark, W., "A New Reflective FPD Technology Using Interferometric Modulation," The Proceedings of the Society for Information Display (May 11-16, 1997).

Nagami et al., "Plastic Cell Architecture: Towards Reconfigurable Computing For General-Purpose," IEEE, 0-8186-8900-, pp. 68-77, (May 1998).

Newsbreaks, "Quantum-trench devices might operate at terahertz frequencies," Laser Focus World (May 1993).

Oliner et al., "Radiating Elements and Mutual Coupling," Microwave Scanning Antennas, vol. 2, pp. 131-141, (1966).

PCT/US02/13442, Search Report Sep. 13, 2002.

PCT/US04/20330 Search Report Nov. 8, 2004.

PCT/US05/029821 International Search Report (Dec. 27, 2005).

PCT/US05/030927 International Search Report (Jan. 25, 2006).

PCT/US05/031693 International Search Report.

PCT/US05/032331 International Search Report (Apr. 7, 2006).

PCT/US05/033558 Partial International Search Report (Feb. 24, 2006).

PCT/US2004/035820 International Search Report and Written Opinion (Apr. 11, 2005).

PCT/US96/17731 Search Report.

Raley et al., "A Fabry-Perot Microinterferometer for Visible Wavelengths," IEEE Solid-State Sensor and Actuator Workshop, Jun. 1992, Hilton Head, SC.

Schnakenberg et al., "TMAHW Etchants for Silicon Micromachining," 1991 International Conference on Solid State Sensors and Actuators-Digest of Technical Papers, pp. 815-818 (1991).

Sperger et al., "High Performance Patterned All-Dielectric Interference Colour Filter for Display Applications," SID Digest, pp. 81-83, (1994).

Sridharan et al. "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.

Stone, "Radiation and Optics, An Introduction to the Classical Theory," McGraw-Hill, pp. 340-343, (1963).

Walker et al., "Electron-beam-tunable Interference Filter Spatial Light Modulator," Optics Letters vol. 13, No. 5, pp. 345-347, (May 1988).

Williams et al., "Etch Rates for Micromachining Processing," Journal of Microelectromechanical Systems, vol. 5, No. 4, pp. 256-259 (Dec. 1996).

Winters et al., "The etching of silicon with XeF2 vapor. Applied Physics Letters," vol. 34, No. 1, pp. 70-73 (Jan. 1979).

Winton, "A novel way to capture solar energy," Chemical Week, (May 1985).

Wu, "Design of a Reflective Color LCD Using Optical Interference Reflectors," Asia Display '95, pp. 929-931, (Oct. 1995).

Zhou et al., "Waveguide Panel Display Using Electromechanical Spatial Modulators" SID Digest, vol. XXIX, (1998).

French, P. J., "Development of surface micromachining techniques compatible with on-chip electronics", *Journal of Micromechanics and Microengineering*, vol. 6 No. 2: 197-211, XP 002360789, Jun. 1996, (1996) IOP Publishing Ltd., UK.

Annex to Form PCT/ISA/206 dated Jan. 9, 2006, Communication Relating to the Results of the Partial International Search, PCT/US2005/032331.

Xactix Xetch Product information.

Butler et al., " An Embedded Overlay Concept for Microsystems Packaging," IEEE Transactions on Advanced Packaging IEEE USA, vol. 23, No. 4, pp. 617-622, XP002379648 (2000).

Hall, Integrated optical inteferometric detection method for micromachined capacitiive acoustic transducers, App. Phy. Let. 80:20(3859-3961) May 20, 2002.

IPRP for PCT/US05/032331 Filed Sep. 9, 2005.

Yao et al., BrF3 dry release technology for large freestanding parylene microstructures and electrostatic actuators, Sensors and Actuators A, vol. 97-98, pp. 771-775, Apr. 2002.

* cited by examiner

|  | Column Output Signals | |
|---|---|---|
|  | $+V_{bias}$ | $-V_{bias}$ |
| Row Output Signals    0 | Stable | Stable |
| $+\Delta V$ | Relax | Actuate |
| $-\Delta V$ | Actuate | Relax |

METHOD OF FABRICATING A FREE-STANDING MICROSTRUCTURE

CROSS REFERENCE TO RELATED APPLICATION

This application claims the benefit of U.S. Application No. 60/613,299, filed Sep. 27, 2004, the disclosure of which is incorporated by reference.

BACKGROUND

1. Field of the Invention

This application is generally related to microelectromechanical systems devices, and more particularly, to optical modulators.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

Provided is a MEMS device comprising an integrated post and deformable layer. In some embodiments, the transition between the post and deformable layer comprises substantially a single arcuate or convex surface, thereby providing a mechanically robust structure. Some embodiments provide a method for fabricating a MEMS device comprising the use of a self-planarizing sacrificial material, which provides a surface conducive to the formation of a relatively uniform deformable layer thereon.

Some embodiments disclosed herein provide a method for fabricating a microelectromechanical systems device comprising: forming a conductive layer over a first sacrificial layer; patterning a movable conductor from the conductive layer; and forming a planar layer of a second sacrificial layer over the movable conductor and first sacrificial layer. Some embodiments of the method further comprises forming an opening in the first sacrificial layer prior to forming the second sacrificial layer, wherein the opening is adjacent to the movable conductor.

Some embodiments further comprise forming a first opening in the second sacrificial layer, wherein the first opening in the second sacrificial layer is adjacent to the movable conductor, and the first opening in the second sacrificial layer is substantially aligned with the opening in the first sacrificial layer. Some embodiments further comprise forming a second opening in the second sacrificial layer, wherein the second opening in the second sacrificial layer is substantially centered over the movable conductor.

Some embodiments of the method further comprise forming a deformable layer over the second sacrificial layer. In some embodiments, the method further comprises removing substantially the entire second sacrificial layer after forming the deformable layer.

Other embodiments provide an interferometric modulator manufactured by a method comprising: forming a mirror layer over a first sacrificial layer; patterning a mirror from the mirror layer; and forming a layer of a second sacrificial layer over the mirror and first sacrificial layer, wherein the second sacrificial layer comprises a self-planarizing material.

Other embodiments provide a microelectromechanical systems device comprising: a movable conductor formed over a first sacrificial layer, and a second sacrificial layer formed over the movable conductor and the first sacrificial layer, wherein the second sacrificial layer comprises a self-planarizing material.

Other embodiments provide a method for fabricating an interferometric modulator comprising: forming a first sacrificial layer; forming a mirror layer over the first sacrificial layer; patterning the reflective layer to form a mirror; and spinning-on a second sacrificial layer over the mirror and the first sacrificial layer.

Other embodiments provide an interferometric modulator comprising: a substrate; a deformable layer; a plurality of posts extending between the substrate and the deformable layer, wherein the posts and deformable layer are integrated; an optical stack formed on the substrate proximal to the deformable layer; a movable mirror disposed between the optical stack and the deformable layer; a connector securing the movable mirror to the deformable layer; and a transition between a post and the deformable layer comprising substantially a single arcuate surface.

Other embodiments provide an apparatus comprising: a substrate; a deformable layer; means integrated with the deformable layer for supporting the deformable layer; a movable conductor disposed between the substrate and the deformable layer; and a connector securing the movable conductor to the deformable layer.

BRIEF DESCRIPTION OF THE DRAWINGS

These and other aspects of the invention will be readily apparent from the following description and from the appended drawings (not to scale), which are meant to illustrate and not to limit the invention.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Embodiments of the MEMS device disclosed herein, for example, an interferometric modulator, comprises an integrated post-deformable layer structure. In some embodiments, the transition between the post and deformable layer comprises substantially a single arcuate or convex surface. In some embodiments, the thickness of the post-deformable layer structure is substantially uniform, thereby providing a physically robust structure with predetermined mechanical characteristics. Also provided is a method for manufacturing a MEMS device, for example, an interferometric modulator. Embodiments of the method form a layer of a self-planarizing sacrificial material conducive to forming a substantially uniform post-deformable layer structure. This layer of the self-planarizing sacrificial material is formed over a patterned movable conductor or mirror. In some embodiments, a first opening is formed in the layer of the self-planarizing sacrificial material adjacent to the movable conductor or mirror, and a deformable layer, which fills at least a portion of the first opening, is formed over the layer of the self-planarizing sacrificial material.

Figure 1:
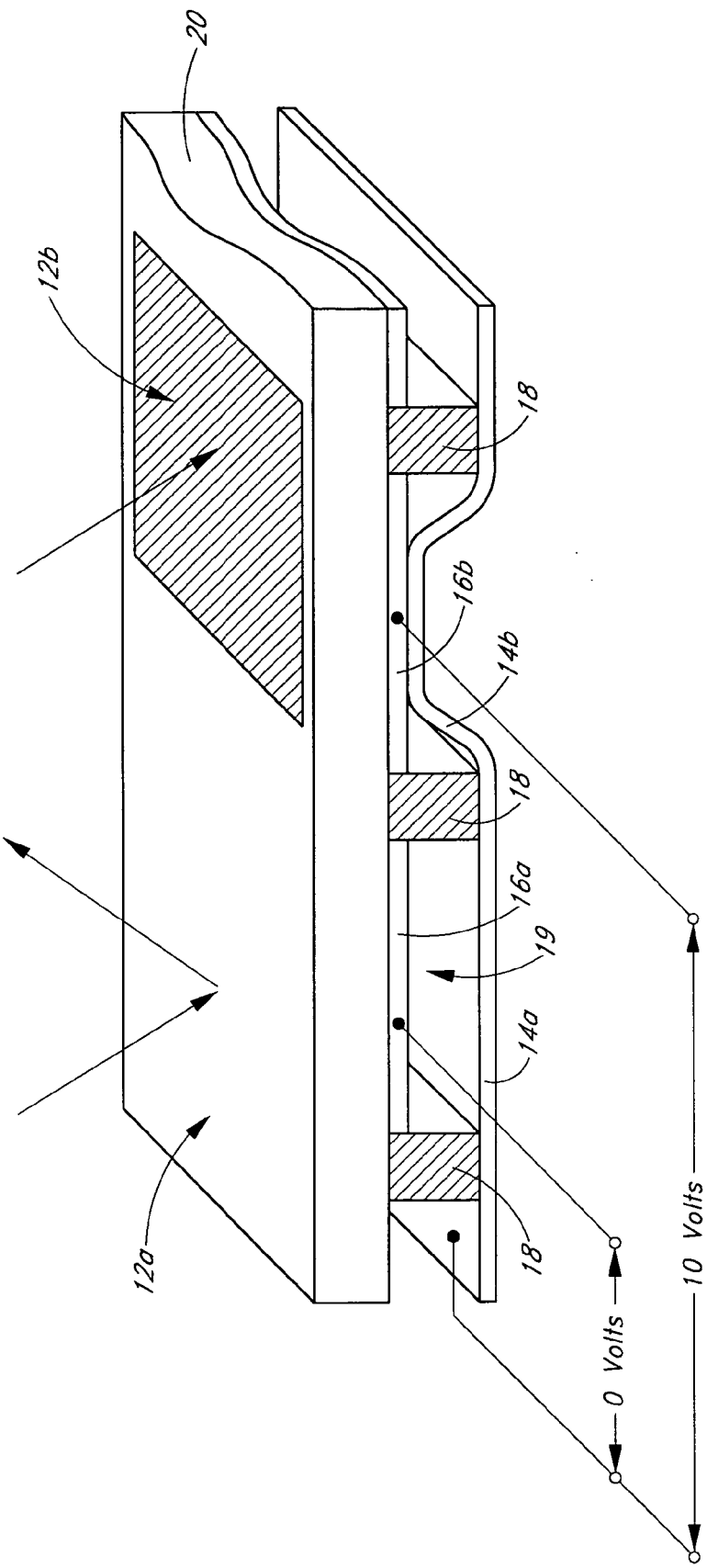
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. In some embodiments, the layers are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIG. 2 through FIG. 5 illustrate one exemplary process and system for using an array of interferometric modulators in a display application.

Figure 2:
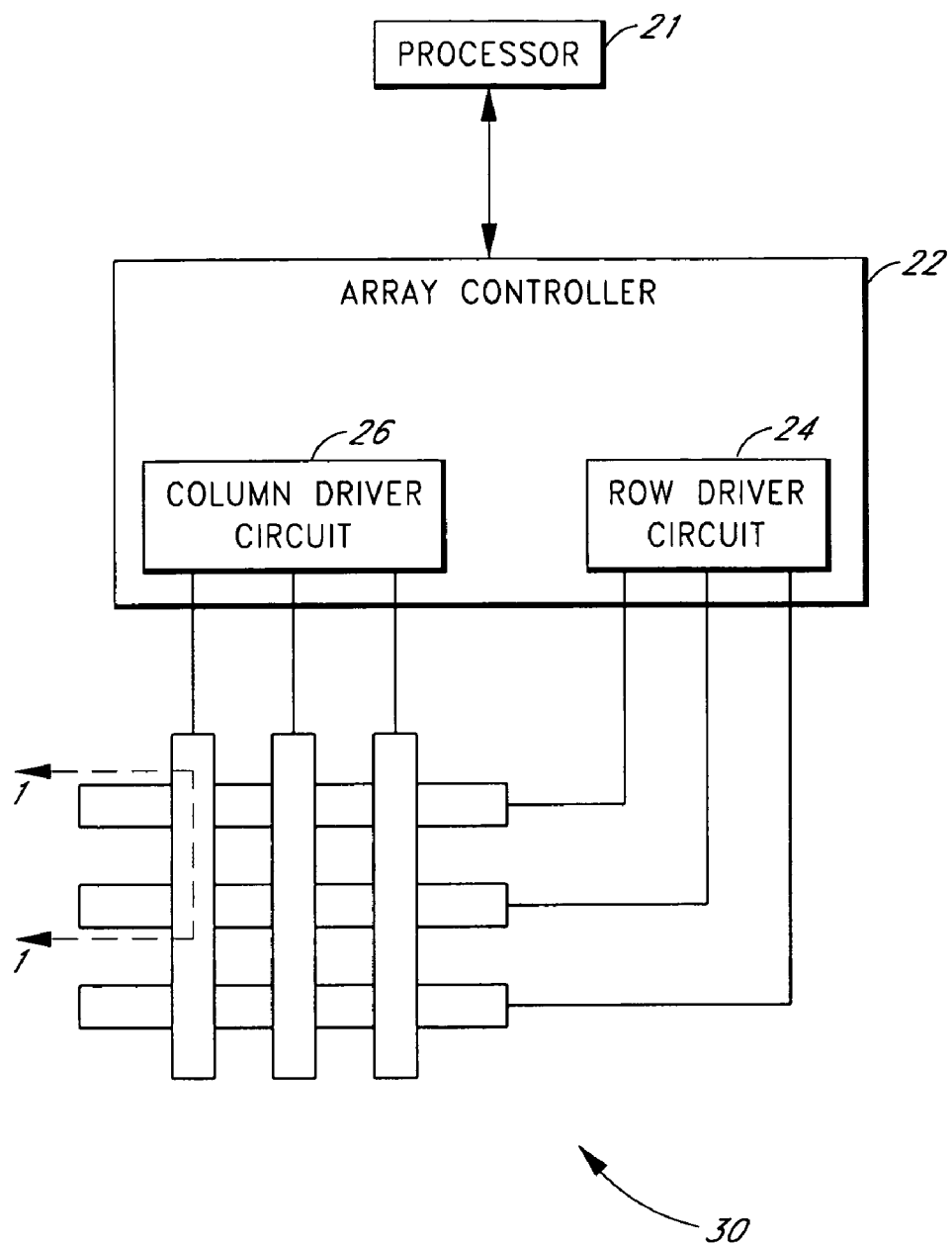
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a panel or display array (display) 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
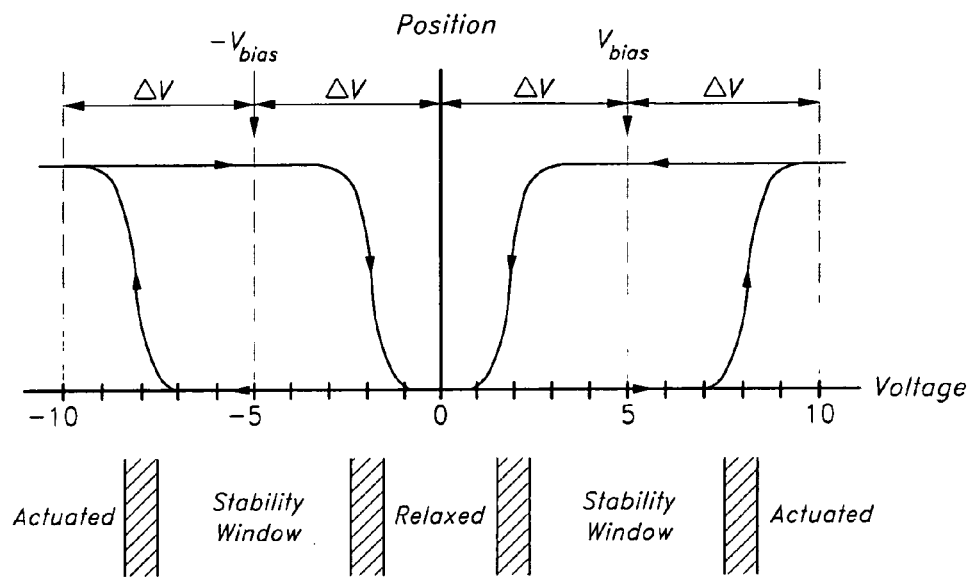
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIG. 4 and FIG. 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
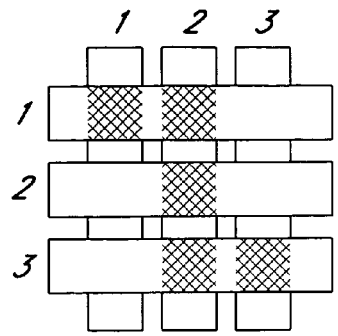
FIG. 5A and FIG. 5B illustrate one exemplary timing diagram for row and column signals that may be used to write a frame of display data to the 3×3 interferometric modulator display of FIG. 2.
Figure 5B:
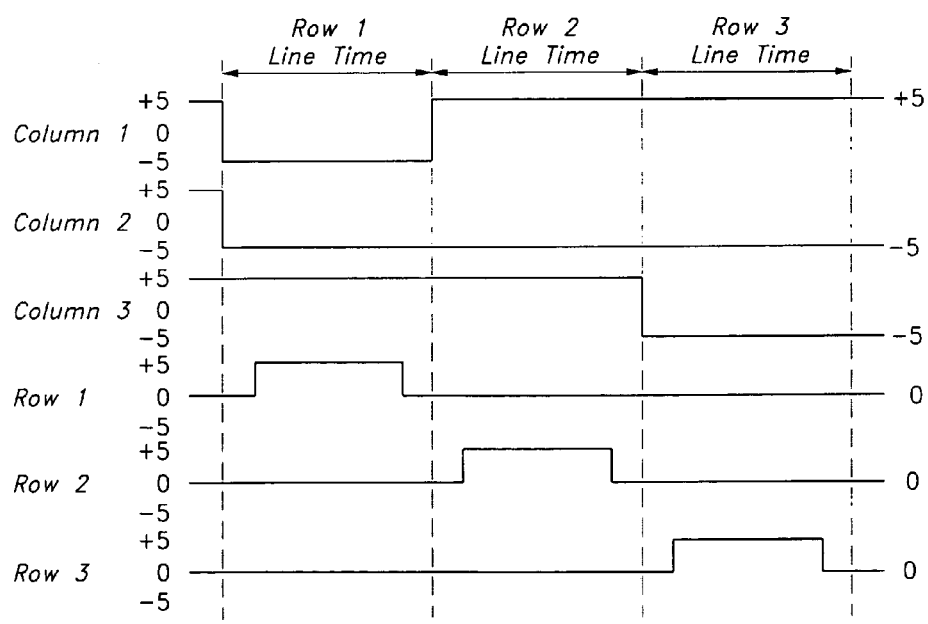

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
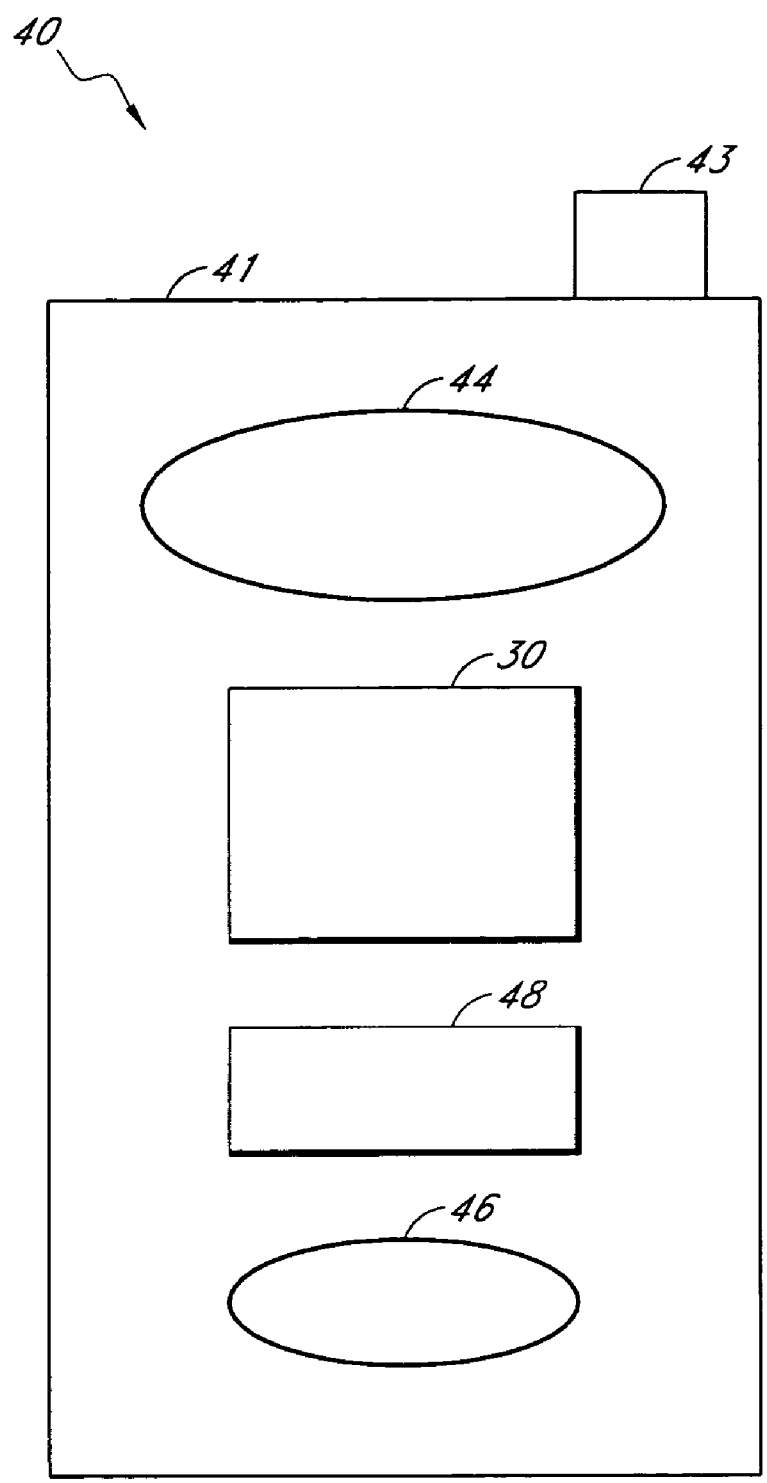
FIG. 6A and FIG. 6B are system block diagrams illustrating an embodiment of a visual display device comprising a plurality of interferometric modulators.
Figure 6B:
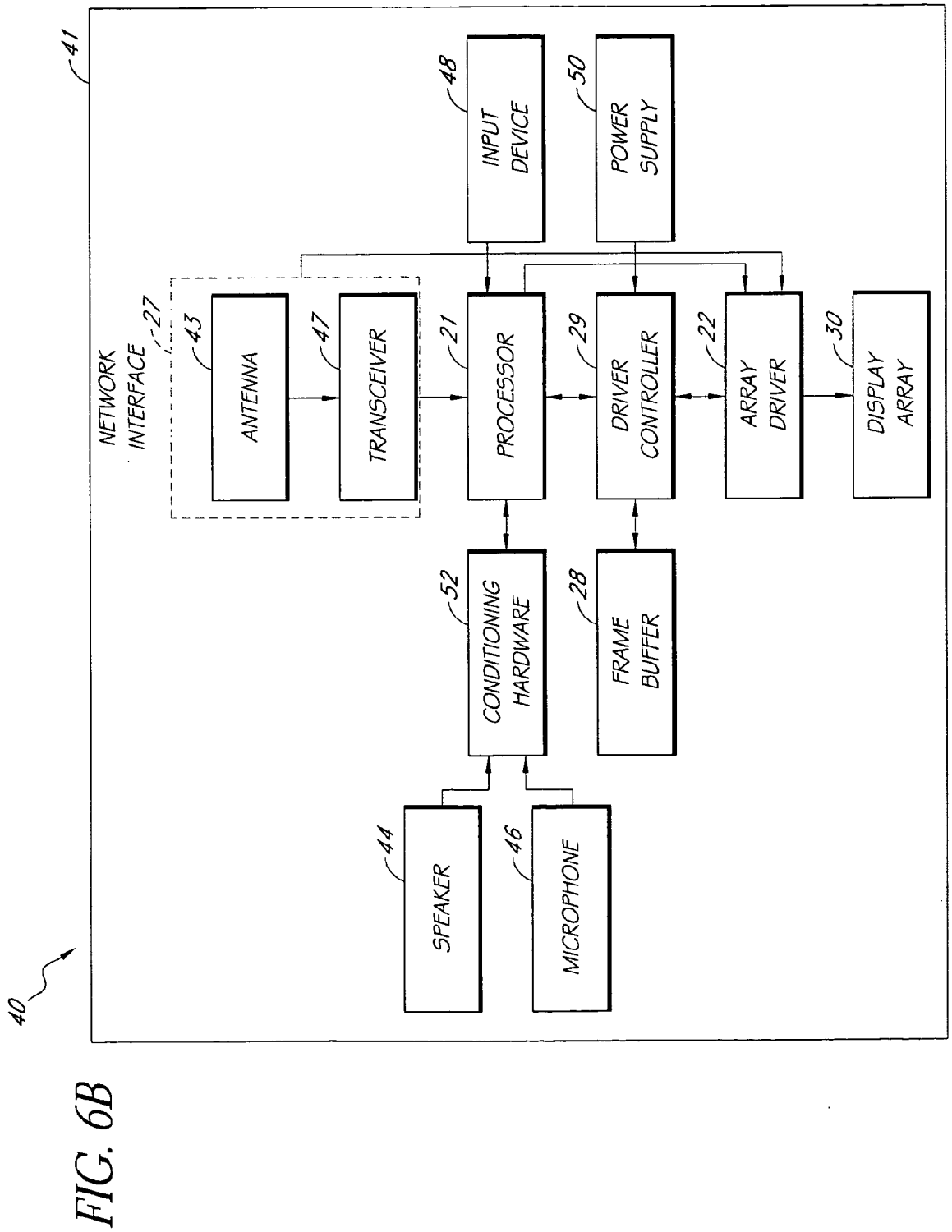

FIG. 6A and FIG. 6B are system block diagrams illustrating an embodiment of a display device 40. The display device 40 can be, for example, a cellular or mobile telephone. However, the same components of the display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of the exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of the exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to the processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28 and to the array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell, including a plastic solar cell, and solar-cell paint. In another embodiment, the power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
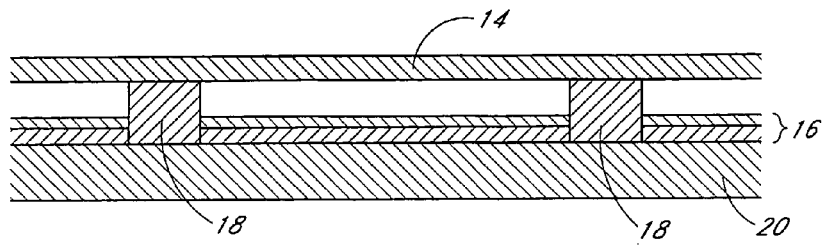
FIG. 7A is a cross section of the device of FIG. 1.
Figure 7B:
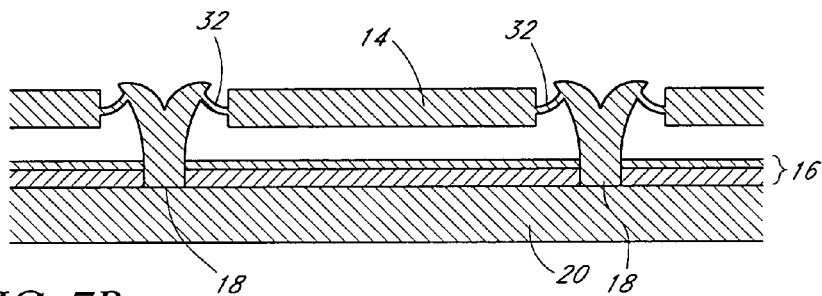
FIG. 7B is a cross section of an alternative embodiment of an interferometric modulator.
Figure 7C:
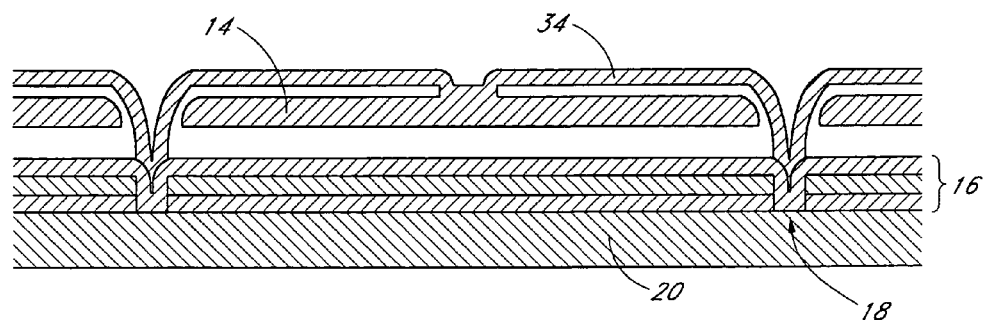
FIG. 7C is a cross section of another alternative embodiment of an interferometric modulator.
Figure 7D:
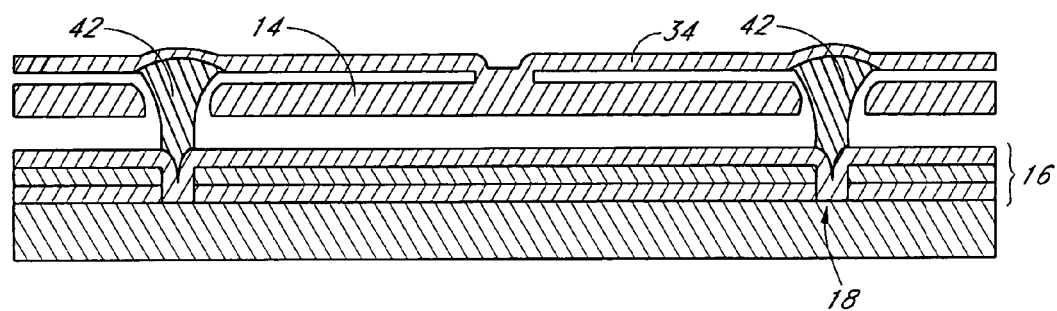
FIG. 7D is a cross section of yet another alternative embodiment of an interferometric modulator.
Figure 7E:
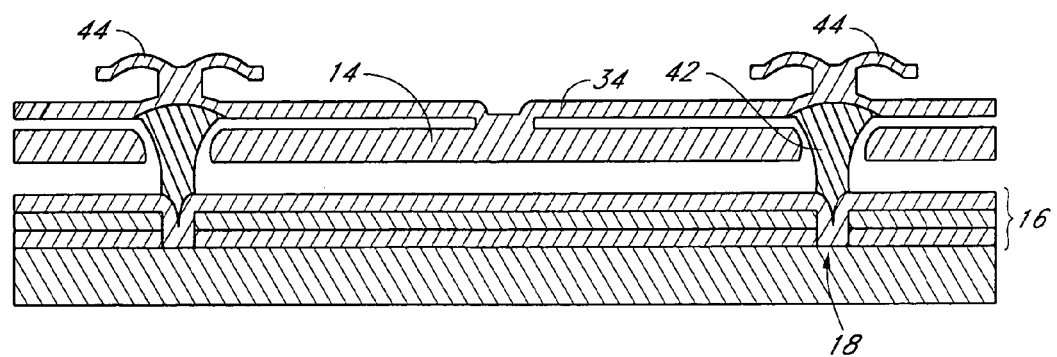
FIG. 7E is a cross section of an additional alternative embodiment of an interferometric modulator.

The details of the structure of interferometric modulators that operate in accordance with the principles set forth above may vary widely. For example, FIG. 7A-FIG. 7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as the support posts 18. The embodiment illustrated in FIG. 7D has support posts 18 that include support post plugs 42 upon which the deformable layer 34 rests. The movable reflective layer 14 remains suspended over the cavity, as in FIG. 7A-FIG. 7C, but the deformable layer 34 does not form the support posts by filling holes between the deformable layer 34 and the optical stack 16. Rather, the support posts 18 are formed of a planarization material, which is used to form the support post plugs 42. The embodiment illustrated in FIG. 7E is based on the embodiment shown in FIG. 7D, but may also be adapted to work with any of the embodiments illustrated in FIG. 7A-FIG. 7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields some portions of the interferometric modulator on the side of the reflective layer opposite the substrate 20, including the deformable layer 34 and the bus structure 44. This allows the shielded areas to be configured and operated upon without negatively affecting the image quality. This separable modulator architecture allows the structural design and materials used for the electromechanical aspects and the optical aspects of the modulator to be selected and to function independently of each other. Moreover, the embodiments shown in FIG. 7C-FIG. 7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8A:
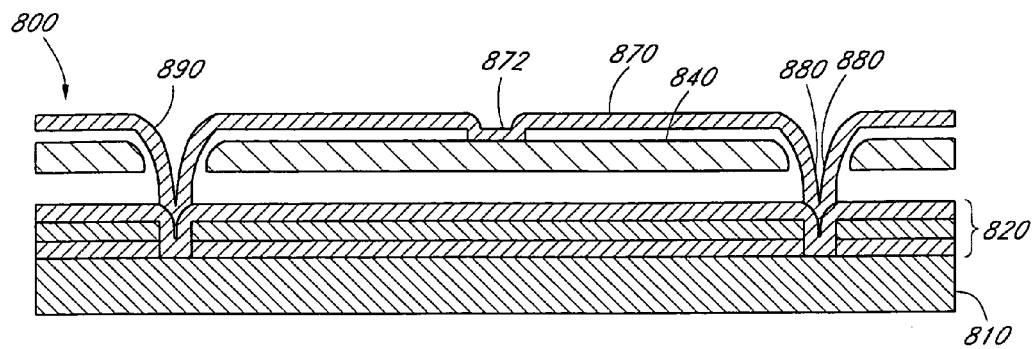
FIG. 8A-FIG. 8G illustrate in cross section an embodiment of the disclosed MEMS device and intermediate stages in an embodiment of the fabrication thereof.

FIG. 8A illustrates a cross section of an embodiment of a microelectromechanical systems device (MEMS) 800, which is similar to the interferometric modulator illustrated in FIG. 7C. As will be apparent to those skilled in the art, certain of the teachings provided herein are also applicable to other MEMS devices, for example, the interferometric modulators illustrated in FIG. 7D and FIG. 7E. The device 800 disclosed herein comprises a substrate 810, a movable conductor 840, a deformable layer 870, and a plurality of support posts 880. In the illustrated embodiment, a connector 872 secures the movable conductor 840 to the deformable layer 870. The terms "mechanical layer" and "flex layer" are also used to refer to the deformable layer 870. The support posts 880 are also referred to herein as "supports" or "posts." Note that in some arrangements, the supports comprise partially or fully enclosing walls rather than isolated columns. In embodiments in which the MEMS device 800 is an interferometric modulator, the device further comprises an optical stack 820 formed on the substrate 810, as described above, and the movable conductor 840 is a mirror. The descriptions provided herein of the MEMS devices and methods for fabricating interferometric modulators are also applicable to other types of MEMS devices, as would be understood by those skilled in the art.

Referring again to FIG. 8A, the deformable layer 870 and at least one of the posts 880 are integrated. In some embodiments, the deformable layer 870 and all of the posts 880 are integrated. As discussed in greater detail below, in some embodiments, the integrated deformable layer 870 and post(s) 880 are formed in the same step. The illustrated embodiment comprises a transition 890 between the integrated deformable layer and post 880 comprising substantially a single arcuate or convex (as viewed from above) surface. An embodiment of a method for fabricating such a transition 890 is discussed in greater detail below.

Figure 8B:
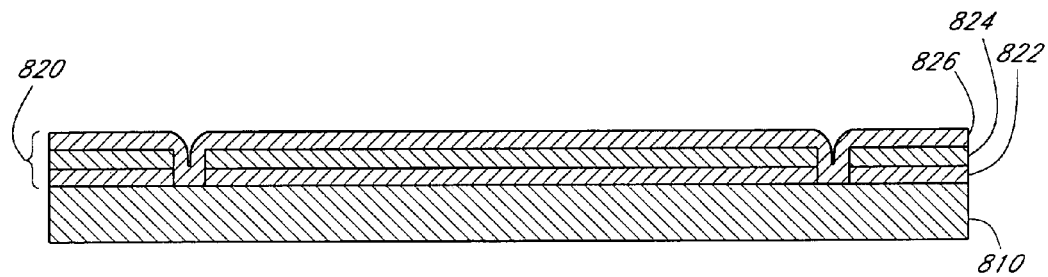
Figure 8C:
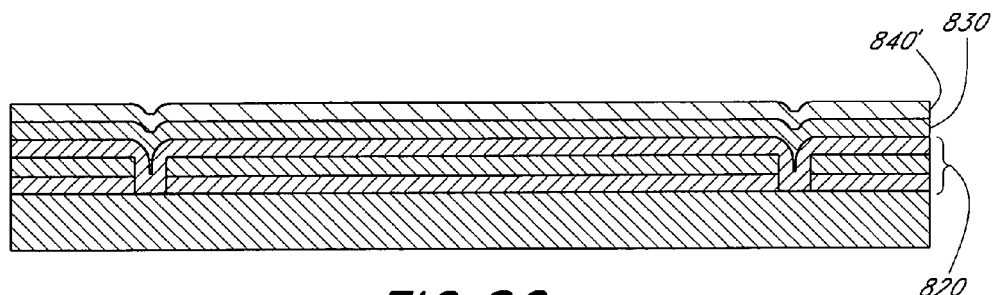
Figure 8D:
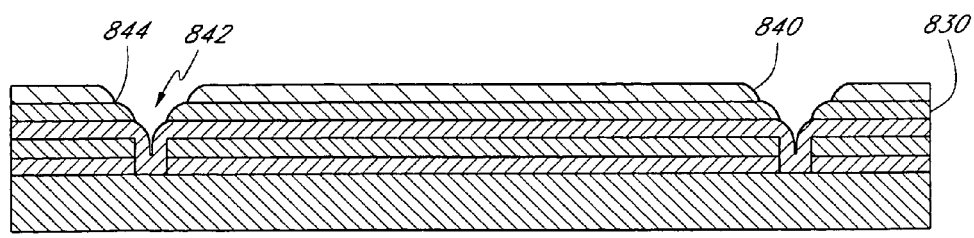
Figure 8E:
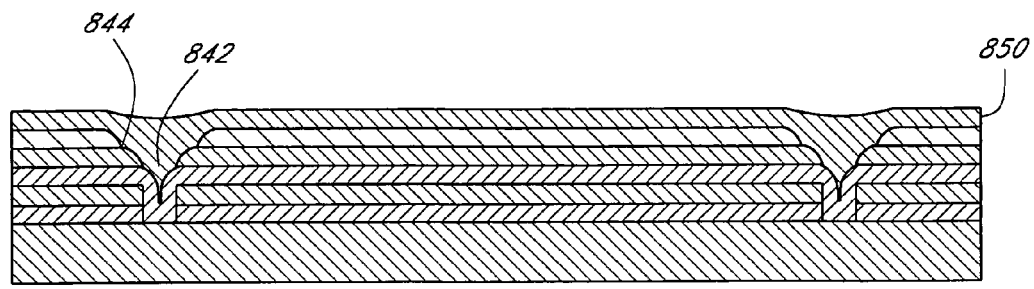
Figure 8F:
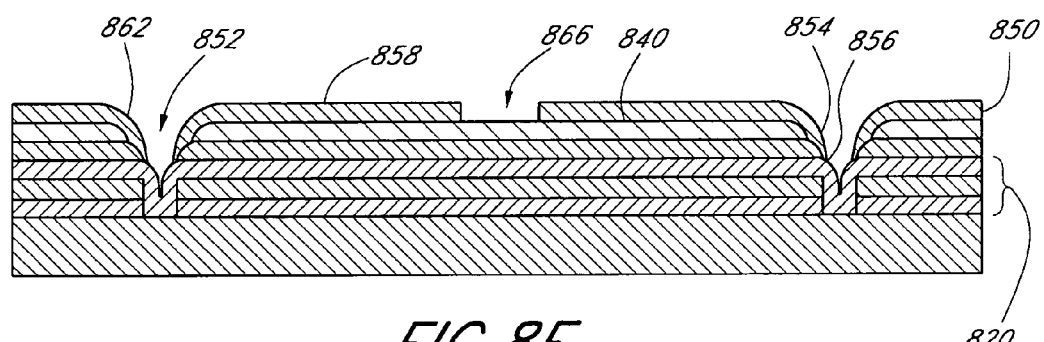
Figure 8G:
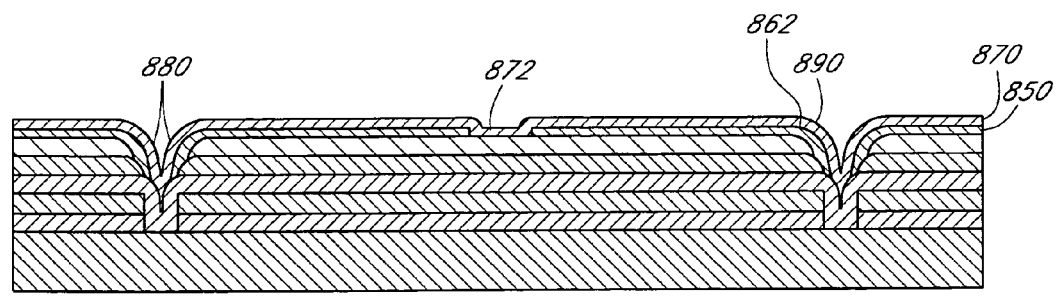
Figure 9:
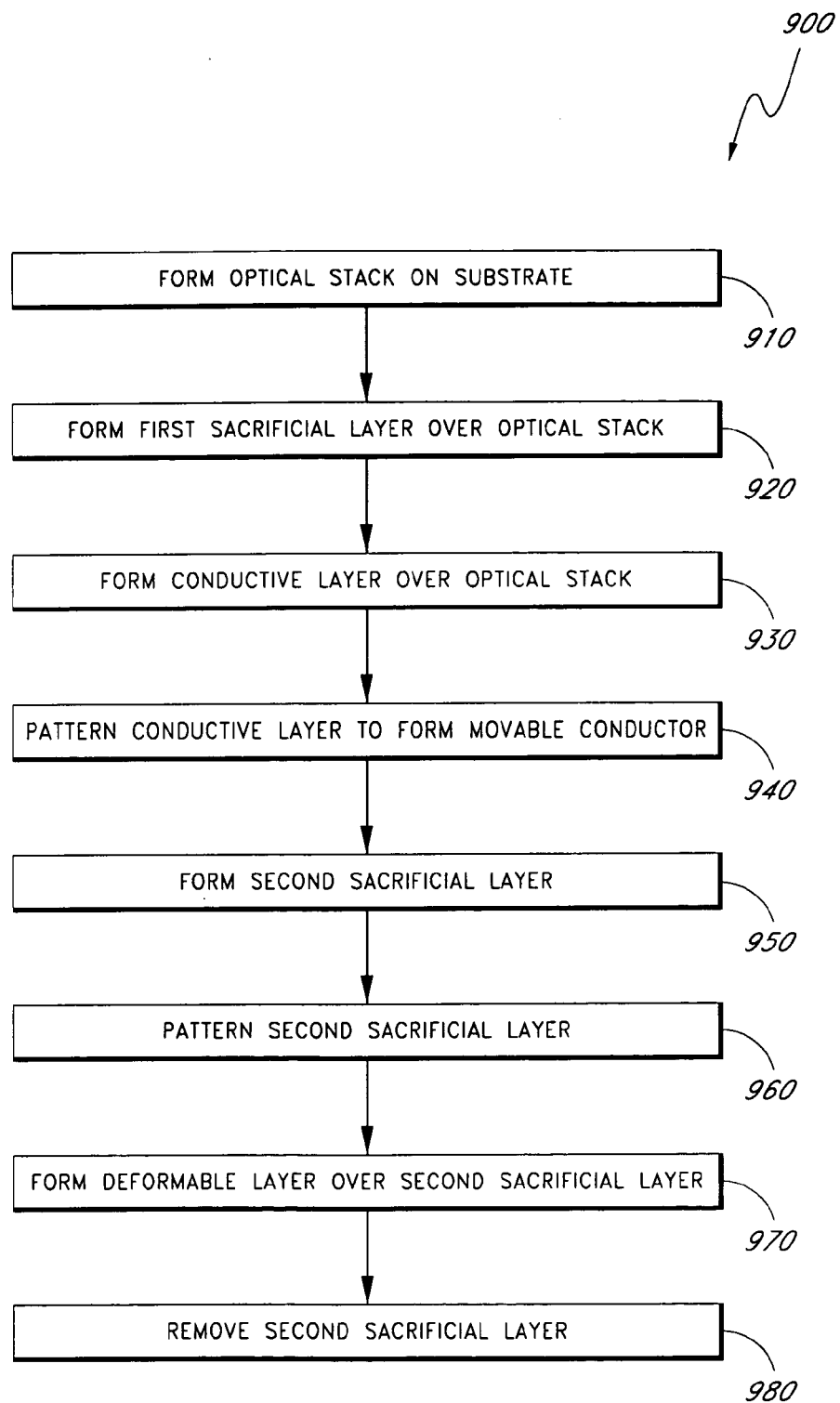
FIG. 9 is a flowchart of an embodiment of a method for manufacturing the MEMS device illustrated in FIG. 8A.

FIG. 9 is a flowchart illustrating an embodiment 900 of a method for fabricating an embodiment of the MEMS device 800 in which the MEMS device is an optical modulator, for example, as illustrated in FIG. 8A. This description makes reference to certain intermediate structures illustrated in FIG. 8B through FIG. 8G. Those skilled in the art will understand that depending on the particular materials selected, some embodiments of the method will include additional steps, for example, forming etch stops and/or hard masks. Those skilled in the art will also understand that in some embodiments, some steps are performed in different orders and/or combined.

In step 910, an optical stack 820 is formed on the substrate 810 as described above. In some embodiments, the optical stack 820 comprises an electrode layer 822, a partially reflective layer 824, and a dielectric layer 826, as illustrated in FIG. 8B. In the illustrated embodiment, the electrode layer 822 and partially reflective layer 824 are formed on the substrate 820, patterned, and the dielectric layer 826 formed thereon.

In step 920, a first sacrificial layer 830 is formed over the optical stack 820, as illustrated in FIG. 8C. In the illustrated embodiment, the first sacrificial layer 830 is from about 300 Å to about 10,000 Å thick, more preferably, from about 1000 Å to about 3000 Å thick. In some embodiments, the thickness of the first sacrificial layer 830 is substantially uniform. The first sacrificial layer 830 comprises a first sacrificial material. Suitable sacrificial materials are known in the art, for example, inorganic sacrificial materials and organic sacrificial material. Examples of suitable inorganic sacrificial materials include silicon, titanium, zirconium, hafnium, vanadium, tantalum, niobium, molybdenum, and tungsten. Examples of suitable organic sacrificial materials include polymeric materials known in the art, including photoreactive polymers, photoresists, and polymers such as polymethylmethacrylate (PMMA). The first sacrificial layer 830 is formed using methods known in the art, which will depend on the particular sacrificial material selected, and include spinning on, physical vapor deposition (PVD), sputtering, chemical vapor deposition (CVD), atomic layer deposition (ALD), and variants thereof. In some preferred embodiments, the first sacrificial material, for example, molybdenum is etchable using $XeF_2$.

In step 930, a conductive layer 840' is formed over the first sacrificial layer 830, as illustrated in FIG. 8C. In embodiments in which the MEMS device is an interferometric modulator, the conductive layer 840' is also referred to as a "reflective layer" or a "mirror layer." In these embodiments, the conductive layer comprises a reflective surface, for example, aluminum, titanium, chromium, silver, or gold. The resulting structure is illustrated in FIG. 8C. Methods for forming the conductive layer 840' are known in the art, for example, PVD, CVD, ALD, and variants thereof. In some embodiments, the conductive layer 840' is from about 0.5 μm to about 1.5 μm thick, preferably, about 1 μm thick. In some embodiments, the conductive layer 840' is a composite comprising a plurality of sub-layers. Some embodiments of composite conductive layers 840' exhibit improved properties, for example, reflectivity, rigidity, weight, ease of manufacture, and the like.

In step 940, the conductive layer 840' is patterned to form a movable conductor 840 as illustrated in FIG. 8D. As discussed above, in the illustrated embodiment, the movable conductor 840 is a movable mirror. In the illustrated embodiment, the conductive layer 840' and first sacrificial layer 830 are patterned using the same mask. In other embodiments, the conductive layer 840' and first sacrificial layer 830 are patterned separately. For example, in some embodiments, after the conductive layer 840' is patterned to form the movable conductor 840, the movable conductor 840 itself acts as a hard mask for patterning the first sacrificial layer 830. In either case, one or more openings 842 in the first sacrificial material are formed that are adjacent to the movable conductor 840 or mirror. Notably, a step or ledge 844 is formed between the first sacrificial layer 830 and the movable conductor 840, the significance of which is discussed below. The resulting structure is illustrated in FIG. 8D.

In step 950, a second sacrificial layer 850 is formed over the movable conductor 840 and the portions of the first sacrificial layer 830 and optical stack 820 exposed in the opening 842 in the first sacrificial layer to provide the structure illustrated in FIG. 8E. In the illustrated embodiment, the second sacrificial layer 850 substantially covers the step or ledge 844 as well as the movable conductor 840. In the illustrated embodiment, the second sacrificial layer 850 also substantially fills the opening 842 in the first sacrificial material. The second sacrificial layer 850 comprises a second sacrificial material. In some preferred embodiments, the second sacrificial material is different from the first sacrificial material. In some embodiments, the second sacrificial layer 850 is a planar layer. As used herein, the term "planar" is used with its usual meaning, and in particular, to refer to a surface that is relatively smoother than the surface over which it is formed. The surface of a planar layer is not necessarily completely smooth. In some preferred embodiments, the second sacrificial material is a photoreactive material, for example, a photoresist. In some preferred embodiments, the second sacrificial material comprises a self-planarizing material, for example, a resist, a photoresist, or a planarization material. Examples of planarization materials include spin-on glass (SOG) or spin-on dielectric (SOD). As used herein, the term "self-planarizing" is used with its usual meaning, and in particular, to refer to a material that is planar as deposited. The second sacrificial layer 850 is formed using methods known in the art, which depend on the selected sacrificial material. In some preferred embodiments, the second sacrificial layer 850 is formed by spin coating. In some embodiments, the thickness and/or uniformity of the thickness of the second sacrificial layer 850 is not critical. The thickness of the second sacrificial layer 850 will depend on the particular application. In some preferred embodiments, the second sacrificial layer is from about 0.2 μm to about 3 μm thick. In other embodiments, the second sacrificial layer 850 is not planar as deposited and is planarized in a separate step, for example, by polishing, by etching, by reflowing, and/or by another post-deposition process known in the art.

In step 960, the second sacrificial layer 850 is patterned to form one or more first openings 852 in the second sacrificial layer using methods known in the art to provide the structure illustrated in FIG. 8F. The first opening 852 is substantially aligned with and/or in the same location as the opening 842 in the first sacrificial layer (illustrated in FIG. 8D). In the illustrated embodiment, the walls 854 of the first opening are lined with the second sacrificial material. In the illustrated embodiment, the optical stack 820 forms least a portion of the bottom 856 of the second opening. In other embodiments (not illustrated), another layer (e.g., the substrate 810 or a for reflection-reducing layer, for example, a black mask, formed on the substrate 810) forms at least a portion of the bottom 856 of the second opening. The transition between a top surface 858 of the second sacrificial layer and the walls 854 of the first opening comprises a single step or ledge 862. In the illustrated embodiment, the second sacrificial material forming the walls 854 of the first opening substantially cover the movable conductor 840 and the first sacrificial layer 830. The illustrated embodiment also comprises a second opening 866 in the second sacrificial layer. In some embodiments, the second opening 866 is substantially centered over the movable conductor 840 or mirror. As discussed in greater detail below, in some embodiments, a connector (872 in FIG. 8A) is formed through the second opening 866.

The walls 854 and/or step or ledge 862 formed in step 960 are conducive to formation of a relatively uniform deformable layer/post structure (870 and 880 in FIG. 8A) over the second sacrificial layer 850. Surface topologies conducive to the formation of such layers are known in the art. In some embodiments, the walls 854 are substantially smoothly sloped, thereby forming smooth steps, for example in the illustrated embodiment. In some embodiments, the step 862 is rounded or gradual, rather than an abrupt. Suitable processes for forming such features are known in the art. In some embodiments, the process or processes reshape the as-deposited topology of the second sacrificial layer 850. For example, in embodiments in which the second sacrificial material comprises a photoreactive material, some embodiments of step 962 include modified exposure of the photoreactive material, for example, one or more of non-uniform exposure, exposure at non-optimized wavelengths, or under-exposure. In some embodiments, the process or processes reshape the after-patterning topology of the second sacrificial layer 850. For example, in some embodiments, the second sacrificial layer 850 is reflowed after etching, for example, by heating.

In step 970, the deformable layer 870 is formed over the second sacrificial layer 850 using methods known in the art to provide the structure illustrated in FIG. 8G. In the illustrated embodiment, the connector 872 and posts 880 are integrally formed with the deformable layer 870. In some embodiments, the deformable layer 870 is conformal. For example, in the illustrated embodiment, the transition 890 between the deformable layer 870 and posts 880 comprises substantially a single step, formed by the step or ledge 862 in the second sacrificial layer 850.

In step 980, the second sacrificial material is substantially completely removed and/or etched away. Those skilled in the art will understand that the particular etching conditions depend on the identity of the second sacrificial material. In some embodiments, the second sacrificial material is selectively removed relative to other structures in the device, for example, the structures illustrated in FIG. 8A. In some embodiments, the second sacrificial material is removed by ashing, for example, where the second sacrificial material is a resist, a photoresist, or a planarization material. In other embodiments, the second sacrificial material is etched away by another method known in the art, for example, by reactive ion etching and/or using a gas phase etchant (e.g., $XeF_2$). In some embodiments, the first sacrificial material is removed in the same step. In other embodiments, the first sacrificial material is removed in a different step. The structure resulting from removing both the first and second sacrificial materials is illustrated in FIG. 8A.

Figure 10A:
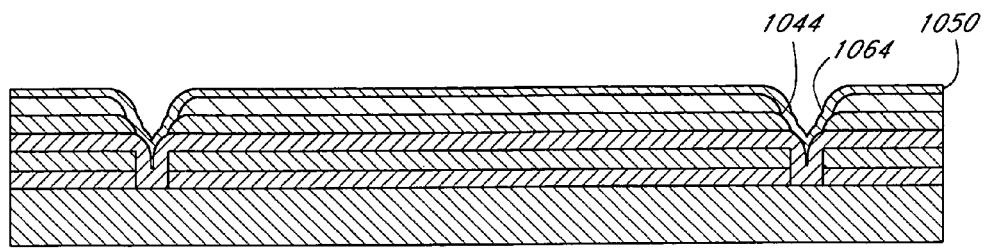
FIG. 10A-FIG. 10C illustrate in cross section intermediate stages in the fabrication of another embodiment of a MEMS device.

FIG. 10A illustrates a structure corresponding to the structure illustrated in FIG. 8E in which a material that is not self-planarizing is used to form the second sacrificial layer 1050 in step 950. An example is a material that forms a conformal layer under the deposition conditions. Rather than covering the step 1044, as in the embodiment illustrated in FIG. 8E, the second sacrificial layer 1050 conforms with the underlying topology, and accordingly, itself comprises a first step or ledge 1064.

Figure 10B:
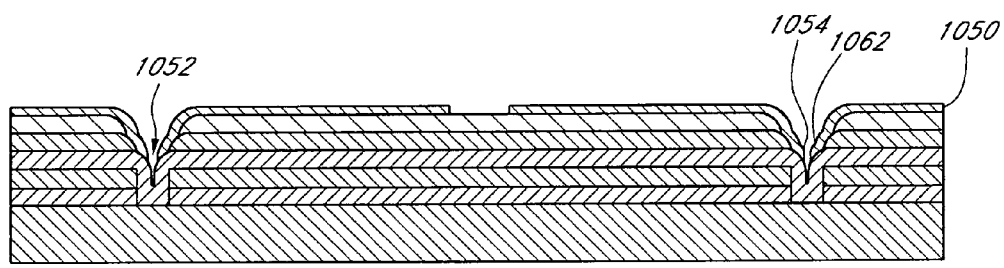

Forming a first opening 1052 through the second sacrificial layer 1050, for example, as described above in step 960, results in a second step or ledge 1062 in the second sacrificial layer, as illustrated in FIG. 10B. In the illustrated embodiment, the second step 1062 is abrupt compared to the gradual step 862 illustrated in FIG. 8F. The walls 1054 of the second opening 1052 are also steep compared to the sloped walls 854 illustrated in FIG. 8F.

Figure 10C:
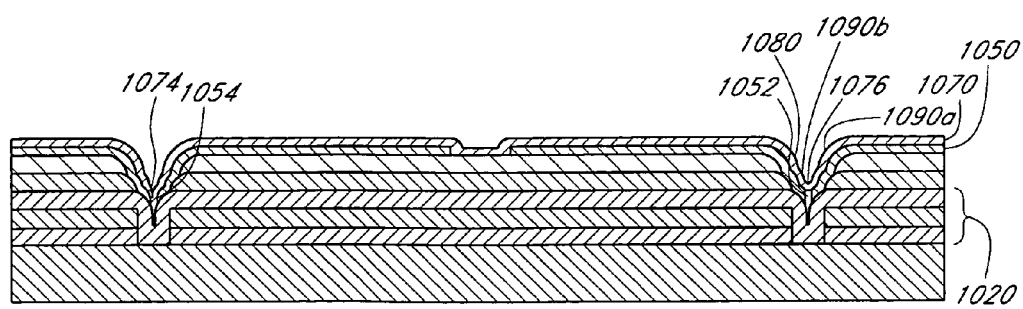

In the embodiment illustrated in FIG. 10C, a deformable layer 1070 formed over the second sacrificial layer 1050, for example, as described above in step 970, includes non-uniform regions 1074 arising from uneven deposition at and around the walls 1054 of the second opening. In the illustrated embodiments, nonuniformities in the deformable layer 1070, either thin regions or thick regions, lead to undesired and/or unpredictable mechanical properties in the deformable layer 1070, for example, insufficient rigidity, excessive rigidity, or even failure. Furthermore the illustrated embodiment, the first and second steps or ledges 1064 and 1062 in the second sacrificial layer 1050 form a transition between the support post 1080 and the deformable layer 1070 comprising at least two arcuate or convex surfaces, 1090a and 1090b, a configuration which also lead to unpredictable properties in the finished device. In some embodiments, the first step 1064 in the second sacrificial layer causes the deformable layer to not fill the first opening 1052, and instead form a "bridge" 1076. This type of defect results in a non-functional device because the deformable layer 1070 is not supported.

Those skilled in the art will understand that changes in the apparatus and manufacturing process described above are possible, for example, adding and/or removing components and/or steps, and/or changing their orders. Moreover, the methods, structures, and systems described herein are useful for fabricating other electronic devices, including other types of MEMS devices, for example, other types of optical modulators.

Moreover, while the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method for fabricating a microelectromechanical systems device comprising:
   forming a conductive layer over a first sacrificial layer;
   patterning a movable conductor from the conductive layer;
   forming a planar layer of a second sacrificial layer over the movable conductor and first sacrificial layer;
   forming an opening in the first sacrificial layer prior to forming the second sacrificial layer, wherein the opening is adjacent to the movable conductor;
   forming a first opening in the second sacrificial layer, wherein
   the first opening in the second sacrificial layer is adjacent to the movable conductor; and
   the first opening in the second sacrificial layer is substantially aligned with the opening in the first sacrificial layer; and
   forming a deformable layer over the second sacrificial layer, and into the first opening in the second sacrificial layer, thereby forming an integrated deformable layer and post.

2. The method of claim 1, wherein forming the second sacrificial layer comprises reflowing the layer, non-uniform exposure of the layer, exposure of the layer at non-optimized wavelengths, under-exposure of the layer, or combinations thereof.

3. The method of claim 1, further comprising forming a second opening in the second sacrificial layer, wherein the second opening in the second sacrificial layer is substantially centered over the movable conductor.

4. The method of claim 1, wherein the first opening in the second sacrificial layer forms a substantially smooth step that substantially covers the movable conductor and the first sacrificial layer.

5. The method of claim 4, wherein the deformable layer substantially conforms to the smooth step.

6. The method of claim 1, further comprising removing substantially the entire second sacrificial layer after forming the deformable layer.

7. The method of claim 1, wherein the second sacrificial material is a self-planarizing material.

8. The method of claim 7, wherein the self-planarizing material comprises a resist, a photoresist, spin-on glass, spin-on dielectric, or combinations thereof.

9. The method of claim 1, wherein the microelectromechanical systems device is an optical modulator.

10. An interferometric modulator manufactured by the method of claim 1.

11. A microelectromechanical systems device comprising:
a movable conductor formed over a first sacrificial layer;
a planar second sacrificial layer formed over the movable conductor and the first sacrificial layer;
an opening in the first sacrificial layer adjacent to the movable conductor;
a first opening in the second sacrificial layer adjacent to the movable conductor and substantially aligned with the opening in the first sacrificial layer; and
a conductive deformable layer over the planar second sacrificial layer, comprising an integrated post extending into the first opening in the second sacrificial layer.

12. The microelectromechanical systems device of claim 11, further comprising a second opening in the second sacrificial material substantially centered over the movable conductor.

13. The microelectromechanical systems device of claim 11, wherein the second sacrificial layer comprises a self-planarizing material.

14. The microelectromechanical systems device of claim 13, wherein the self-planarizing material comprises a resist, a photoresist, spin-on glass, spin-on dielectric, or combinations thereof.

15. The microelectromechanical systems device of claim 11, wherein the microelectromechanical systems device is an optical modulator.

16. The method of claim 3, wherein forming a deformable layer over the second sacrificial layer comprises forming the deformable layer through the second opening of the second sacrificial layer, wherein the deformable layer contacts the movable conductor, thereby forming an integrated deformable layer and connector.

17. The microelectromechanical systems device of claim 12, wherein the deformable layer comprises an integrated connector extending through the second opening in the second sacrificial layer and contacting the movable conductor.

* * * * *